(12) United States Patent
Park et al.

(10) Patent No.: US 8,513,103 B2
(45) Date of Patent: Aug. 20, 2013

(54) METHOD FOR MANUFACTURING VERTICAL TRANSISTOR HAVING BURIED JUNCTION

(75) Inventors: Eun Shil Park, Guri-si (KR); Yong Seok Eun, Seongnam-si (KR); Kyong Bong Rouh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/252,504

(22) Filed: Oct. 4, 2011

(65) Prior Publication Data

US 2012/0112270 A1 May 10, 2012

(30) Foreign Application Priority Data

Nov. 8, 2010 (KR) .................. 10-2010-0110515

(51) Int. Cl.
*H01L 21/425* (2006.01)
(52) U.S. Cl.
USPC .......................................... 438/525
(58) Field of Classification Search
CPC .................. H01L 21/26586; H01L 21/26506; H01L 29/66659
USPC ............................................ 438/525, 530, 270
See application file for complete search history.

(56) References Cited

U.S. PATENT DOCUMENTS

2007/0235833 A1* 10/2007 Cheng et al. .................. 257/506
2010/0090348 A1* 4/2010 Park et al. ..................... 257/773

FOREIGN PATENT DOCUMENTS

| KR | 1020010017389 A | 3/2001 |
| KR | 1020010088057 A | 9/2001 |
| KR | 1020030078326 A | 10/2003 |
| KR | 1020090074530 A | 7/2009 |

* cited by examiner

*Primary Examiner* — Nikolay Yushin
(74) *Attorney, Agent, or Firm* — William Park & Associates Patent Ltd.

(57) ABSTRACT

A buried junction is formed in a vertical transistor of a semiconductor device. Wall bodies are formed from a semiconductor substrate, the wall bodies protruding while having a first side surface and a second side surface in the opposite side of the first side surface; forming a one side contact mask having an opening which selectively opens a portion of the first side surface of the wall body; and forming a first impurity layer and a second impurity layer surrounding the first impurity layer by diffusing impurities having different diffusivities into the portion of the first side surface exposed to the opening.

29 Claims, 26 Drawing Sheets

METHOD FOR MANUFACTURING VERTICAL TRANSISTOR HAVING BURIED JUNCTION

CROSS-REFERENCES TO RELATED APPLICATIONS

The present application claims priority under 35 U.S.C. 119(a) to Korean Application No. 10-2010-0110515, filed on Nov. 8, 2010 in the Korean intellectual property Office, and which is incorporated herein by reference in its entirety.

BACKGROUND

Exemplary embodiments of the present invention relate to a semiconductor device, and more particularly to a vertical transistor having a buried junction by hybrid doping and a method for manufacturing the same.

With increasing integration of semiconductor devices, emphasis has been made to integrate a larger number of unit devices such as transistors in a limited substrate area. A MOSFET device having a planar structure and a planar-type transistor include junctions positioned on either side of a transistor gate on the surface of a substrate, thereby forming a horizontal channel. In order to integrate a greater number of transistors in a limited area of the substrate, a reduction in the channel length of each transistor is required.

However, reducing transistor channel length in a horizontal direction has met with many difficulties due to opposing physical limitations such as leakage current, short channel effect, and on-current reduction. The ability to further miniaturize planar structure in horizontal directions is approaching its limit. Accordingly, a vertical transistor structure has been proposed. This structure utilizes an active region that protrudes vertically as opposed to horizontally in the case of a planar structure.

In the vertical transistor structure, junctions should be formed over and under the channel set in the vertical direction. However, there are technical difficulties in forming a buried junction under the channel due to a geometrical factor associated with the vertical structure of the transistor. The distance between the buried junction and a channel region overlapping a vertical gate may vary depending on the formation position of the buried junction in the vertical direction and the diffusion depth of the junction. Such variation in distance may have an effect on a threshold voltage Vt of the channel. When the diffusion depth of the junction is insufficient, the distance between the channel and the buried junction may increase, thereby increasing the threshold voltage Vt of the channel. Therefore, the position of the junction with respect to the channel area and the diffusion profile of the junction need to be controlled with precision. Furthermore, when the dopant concentration of the junction is low, contact resistance of interconnections contacting the junction may increase.

SUMMARY

In one embodiment, a method for manufacturing a junction of a vertical transistor includes forming a trench in a semiconductor substrate, thereby forming first and second wall bodies. The trench has sidewalls comprising a first side surface of the second wall body and a second side surface of the first wall body. A one side contact mask may be formed that has an opening that selectively exposes a portion of only the first side surface of the second wall body. A first impurity layer in the second wall body and a second impurity layer surrounding the first impurity layer may be formed by diffusing impurities having different diffusivities in to the portion of the first side surface exposed by the opening.

In another embodiment, a method for forming a junction of a vertical transistor includes forming a first and second wall bodies from a semiconductor substrate, where each of the wall bodies have a first side surface and an opposing second side surface. A first impurity layer and a second impurity layer having a lower concentration than the first impurity layer are formed in a portion of the first side surface of the wall body such that the second impurity layer surrounds the first impurity layer.

In another embodiment, a method for manufacturing a vertical transistor includes forming vertically rising first and second wall bodies from a semiconductor substrate. Each of the wall bodies have a first side surface and an opposing second side surface where the first and second wall bodies are separated by a first trench. A one side contact mask having an opening which selectively exposes a portion of the first side surface of the second wall body is formed. A buried junction including a first impurity layer and a second impurity layer surrounding the first impurity layer is formed by diffusing first and second impurities having different diffusivities into the portion of the first side surface exposed by the opening. A buried bit line is formed between the wall bodies, where the buried bit line is electrically coupled to the buried junction via the opening of the one side contact mask.

In another embodiment, a vertical transistor includes a plurality of active pillars protruding from a semiconductor substrate and each active pillar having a first side surface and an opposing second side surface. An embodiment may also have a one side contact mask having an opening which selectively exposes a lower portion of the first side surface of the active pillar. A buried junction in the vertical transistor may include a first impurity layer and a second impurity layer surrounding the first impurity layer, wherein the first and second impurity layers are formed by diffusing impurities having different diffusivities into the portion of the first side surface exposed by the opening. A buried bit line buried between the active pillars may contact the buried junction through the opening of the one side contact mask.

The impurities may include arsenic (As) and phosphorus (P), the first impurity layer may be formed including As, and the second impurity layer may be formed including P, where there may be a diffusivity difference between As and P.

BRIEF DESCRIPTION OF THE DRAWINGS

The above and other aspects, features and other advantages will be more clearly understood from the following detailed descriptions taken in conjunction with the accompanying drawings, in which.

DESCRIPTION OF SPECIFIC EMBODIMENTS

Embodiments of the present invention will be described with reference to accompanying drawings. However, the embodiments are for illustrative purposes only and are not intended to limit the scope of the invention.

Figure 1:
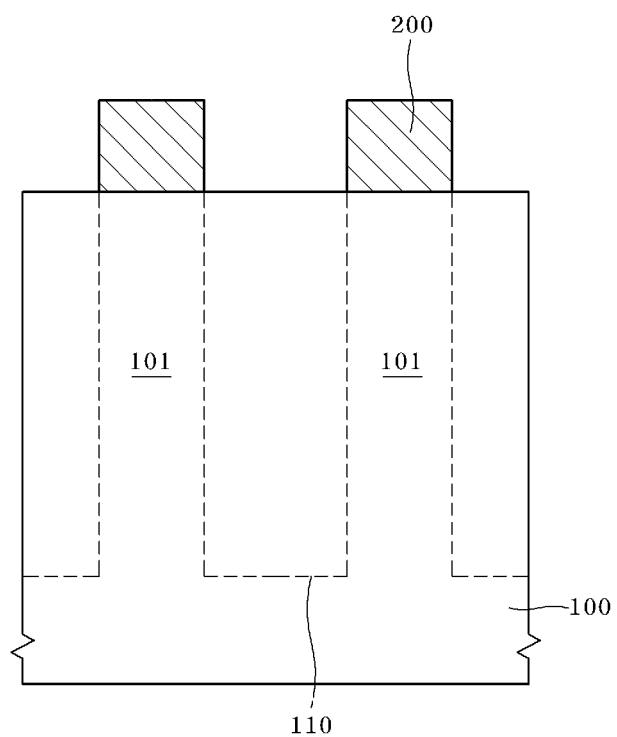
FIGS. 1 to 16 are diagrams illustrating a vertical transistor having a buried junction and a method for manufacturing the same in accordance with an embodiment of the present invention.

Referring to FIG. 1, an etch mask 200 is formed on a semiconductor substrate 100 such as a silicon substrate. In the case of a DRAM device, the etch mask 200 may be formed in a line shape extending in a direction of a bit line. The etch mask 200 may be used in an etching process for forming a first trench 110 defining active regions 101. The etch mask 200 may include insulator material such as, for example, silicon nitride ($Si_3N_4$) having etch selectivity with silicon in the semiconductor substrate 100.

Figure 2:
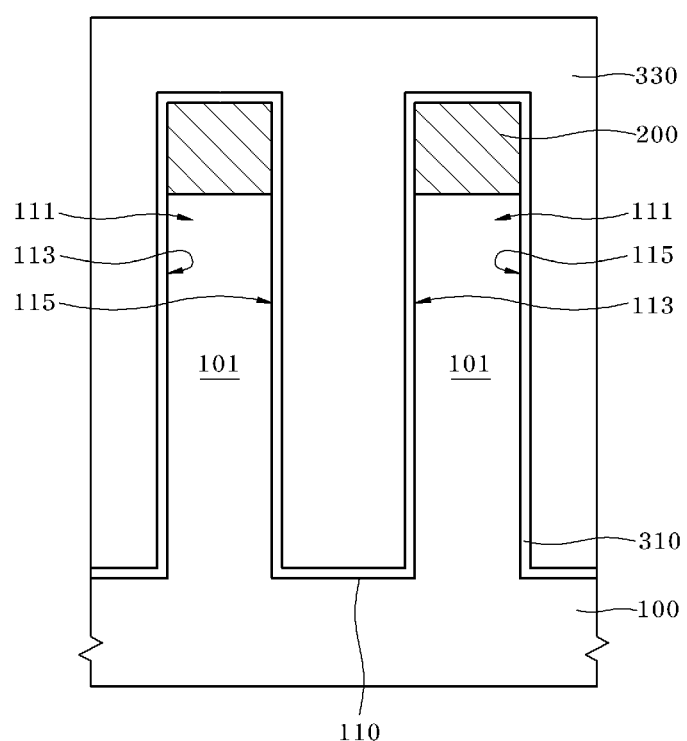

Referring to FIG. 2, portions of the semiconductor substrate 100 exposed by the first mask pattern 200 are selectively etched to form the first trench 110 with wall bodies 111 on either side of the first trench 110. The wall bodies 111 may each comprise an active region 101 and first and second side surfaces 113 and 115. The wall body 111 including the active region 101 is in a direction vertical to the surface of the substrate 100.

A first liner 310 is formed to cover the side surfaces 113 and 115 of the wall bodies 111 and the bottom surface of the first trench 110. The first liner 310 is introduced to form a one side contact mask in the trench 110 that selectively opens a lower portion of the first side surface 113 in subsequent processes. When introduced to form a memory cell of a DRAM device, the vertical transistor in accordance with an embodiment of the present invention is configured to include a gate on a side of the active region 101, a buried junction (e.g., a drain) provided under the active region 101, and a corresponding upper junction (e.g., a source) at an upper end portion of the active region 101. The buried junction may be placed in contact with and coupled to a buried bit line (not shown in FIG. 2), which is buried in the bottom portion of the first trench 110. The connection to the buried bit line is made through a one side contact which is in contact with the buried junction only at the first side surface 113. To implement such a one side contact, a one side contact mask having an opening on only a portion of the first side surface 113 is required.

The first liner 310 may be formed by depositing or thermally oxidizing a layer such as, for example, silicon oxide ($SiO_2$). The first liner 310 may serve as a layer for isolating and insulating the active region 101 from the buried bit line formed to fill the bottom portion of the first trench 110. A buried layer 330 is formed to fill the first trench 110 over the first liner 310. The buried layer 330 may be formed by depositing a material layer such as, for example, a polysilicon layer having etch selectivity with the first liner 310.

Figure 3:
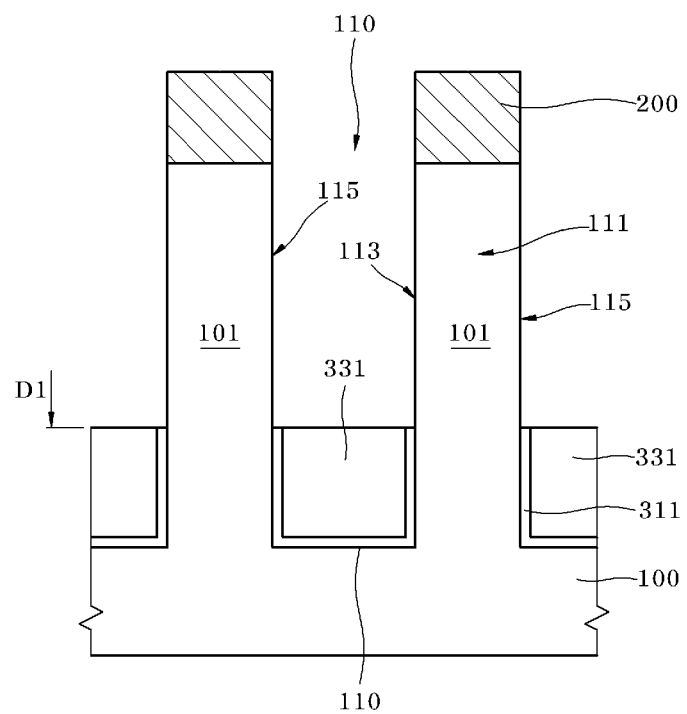

Referring to FIG. 3, a first recess process is performed to recess the buried layer 330 such that the recessed buried layer is at the bottom portion of the first trench 110. The first recess process is performed so that the upper surface of the recessed buried layer 331 is at a first depth D1 from the bottom of the first trench 110. The first depth D1 may be varied according to the placement of a buried junction (e.g., a drain) that is to be formed in the active region 101. When the buried layer 330 is recessed by the first recess process, the first liner 310 may also be recessed. Since the buried layer 330 may have etch selectivity to the first liner 310, an additional process may need to be performed to selectively etch a portion of the first liner 310 exposed by the first recess process. Accordingly, unrecessed portions of the first liner 311 remain in between the recessed buried layer 331 and the active region 101.

Figure 4:
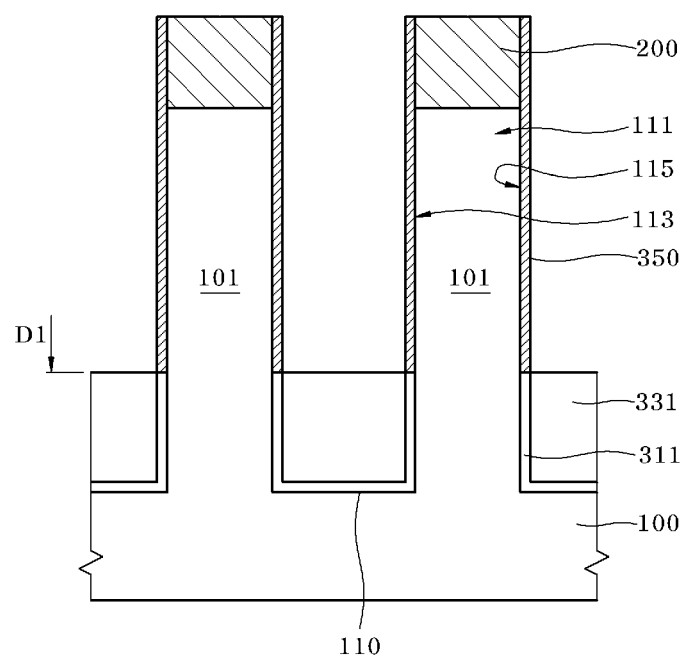

Referring to FIG. 4, a second liner 350 is formed on the side walls 113 and 115 of the active regions 101 that have been exposed by recessing portions of the first liner 310. Each second liner 350 is formed on a side wall (113 or 115) of an active region 101 such that an end is connected to an end of the corresponding first liner 311. The second liner 350 may be formed in a spacer shape by depositing a material such as, for example, silicon nitride, having etch selectivity with the first liner 311, and then by anisotropically etching the deposited material. The anisotropic etching for forming the spacer shape of the second liner 350 may partially expose the buried layer 331, as shown with respect to FIG. 5. The spacer shape may refer to two surfaces separated by space.

Figure 5:
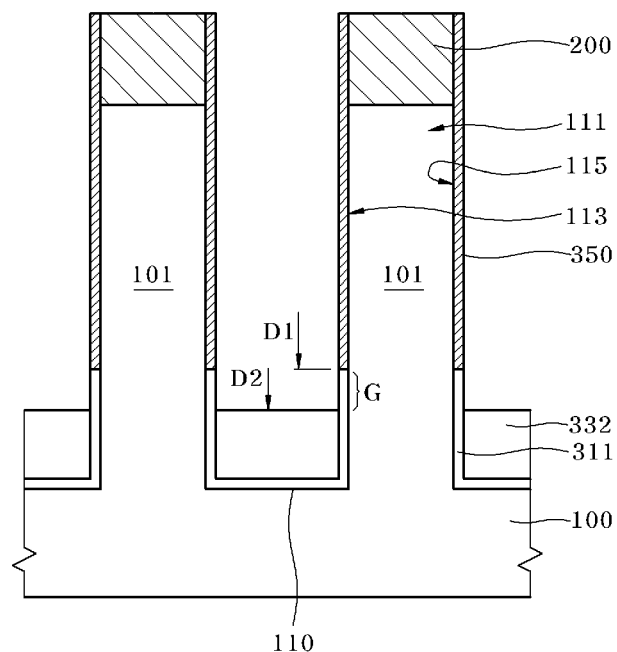

Referring to FIG. 5, the buried layer 331 having a first depth D1 in the first trench 110 as shown in FIG. 4 is further recessed to a second depth D2 by a second recess process. This further recessed buried layer may be referred to as a buried layer 332. Accordingly, a portion G of the first liner 311 is exposed in the first trench 110 due to further recessing of the buried layer 331 in forming the buried layer 332. The exposed portion G of the first liner 311 may vary to correspond to a portion that is to be one-side etched in a subsequent process to expose a portion of the active region 101 for forming a buried junction (e.g., a drain). Therefore, the exposed portion G of the first liner 311 may be set in consideration of the width of a junction corresponding to the drain of a vertical transistor. The first liner 311, the second liner 350, and the buried layer 332 serve as a mask by which a portion of the active region 101 is set to form a buried junction. That is, the mask includes the first liner 311 covering a portion of the lower sidewall of the active region 101 as a first portion, the buried layer 332 to a second depth D2 as a second portion, and the second liner 350 as a third portion covering the upper sidewalls of the active region 101 that are not covered by the first portion.

Figure 6:
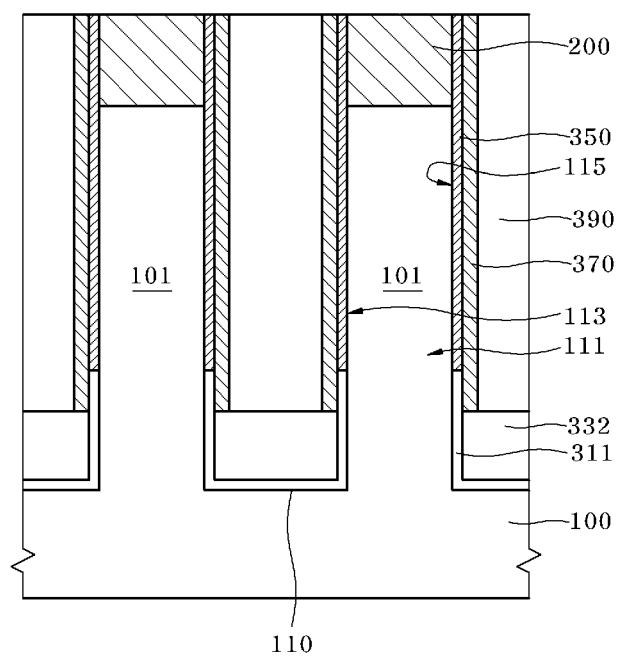

Referring to FIG. 6, a third liner 370 is formed to cover the second liner 350 and the exposed portion G of the first liner 311. The third liner 370 is introduced so that one of the first and second sidewalls 113 and 115 facing each other in the trench 110 is etched. This may be referred to as "one-side etching" and may be used to later selectively expose the exposed portion G of the first liner 311. If the first sidewall 113 is to be one-side etched, the second liner 350 needs to be maintained as a mask for covering the second sidewall 115 of the active region 101, and the third liner 370 may be formed with material such as, for example, titanium nitride (TiN), having etch selectivity with the second liner 350. A TiN layer may be deposited and anisotropically etched to form the third liner 370 in a spacer shape. The anisotropic etching may be performed so as to expose the upper surface of the buried layer 332.

Then, a sacrifice layer 390 is formed to fill the first trench 110 to cover the third liner 370 and the buried layer 332. The sacrifice layer 390 serves as a mask for a one-side etching process where a portion of only one of the third liners 370 on the sidewalls 113 and 115 in the first trench 110 is selected and etched. That is, the sacrifice layer 390 serves as a mask for preventing etching of the unselected third liner 370. Therefore, the sacrifice layer 390 may be formed by depositing material such as, for example, silicon oxide ($SiO_2$), having etch selectivity with the third liner 370, and then etching back or polishing the deposited material. Polishing of the deposited material may be performed by a chemical mechanical polishing (CMP) process. By performing the CMP process on the sacrifice layer 390, the upper surface of the etch mask 200 may be exposed.

Figure 7:
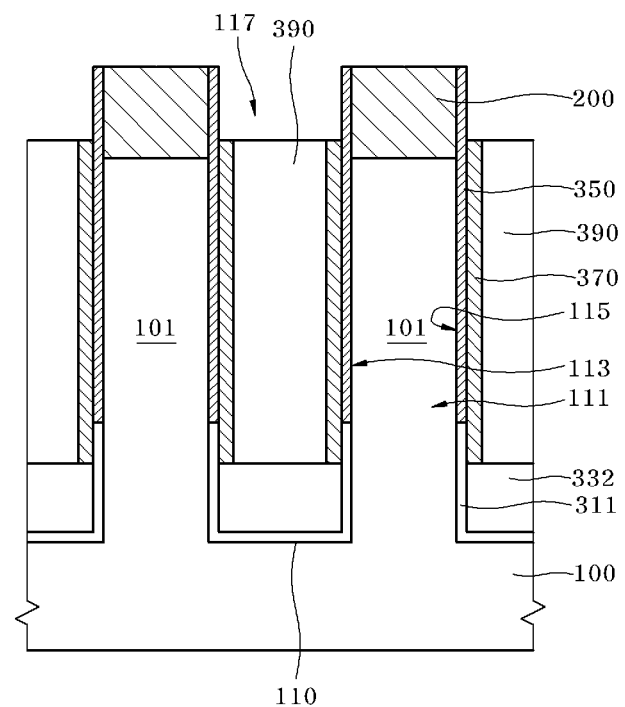

Referring to FIG. 7, the sacrifice layer 390 and the third liners 370 are recessed to a predetermined depth, thereby forming a second trench 117. Thus, only the second liner 350 is on each side wall 113 or 115 in the second trench 117. On the bottom of the second trench 117, only an upper surface of the recessed third liner 370 and an upper surface of the recessed sacrifice layer 390 are exposed.

Figure 8:
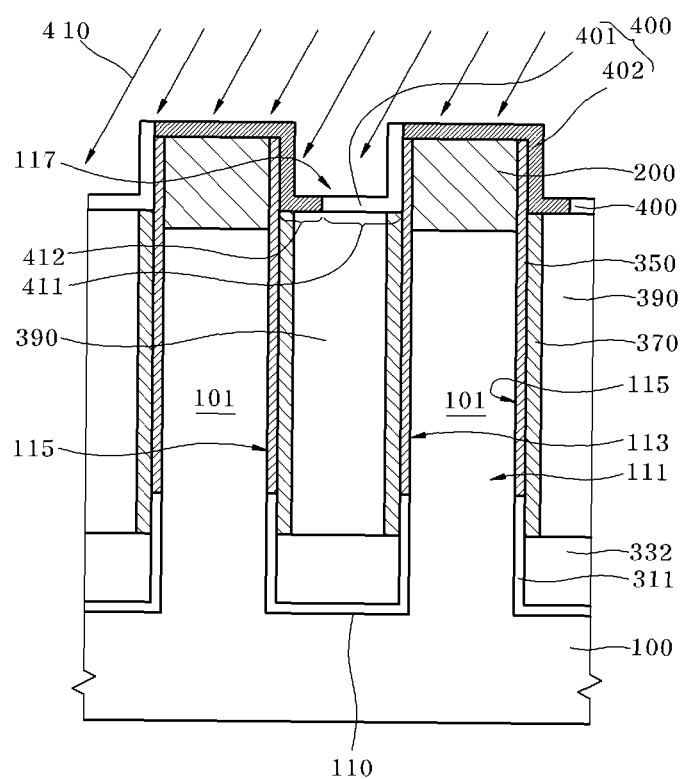

Referring to FIG. 8, an etch barrier layer 400 having first and second portions 401 and 402 is formed over the second trench 117. The first portion 401 includes a first bottom corner portion 411, and the second portion 402 includes a second bottom corner portion 412. The etch barrier layer 400 is used to form an etch barrier for patterning a one side contact mask that selects and exposes one of the bottom corner portions 411 and 412 in the second trench 117. Such an etch barrier 400 may be formed by depositing, for example, a polysilicon layer.

After the etch barrier layer 400 is formed, an oblique ion implantation 410 is performed to implant impurity ions into the second portions 402 having the second bottom corner portion 412 of the etch barrier 400. The oblique ion implantation 410 is performed in such a manner that impurity ions are implanted two times at oblique angles, for example, at oblique angles of 10 and 20 degrees with respect to a direction perpendicular to the semiconductor substrate 100. Due to the oblique angle, the impurity ions are not implanted into the first portion 401 of the etch barrier layer which is covered by a shadow effect caused by the wall body 111 and the etch mask 200, but the impurity ions are selectively implanted only into the second portion 402 which is not covered by the shadow effect of the wall body 111. The impurity ions may be material such as, for example, boron (B), arsenic (As), or phosphorus (P).

Due to the impurity ions partially implanted into the second portion 402 of the etch barrier layer 400 formed of polysilicon, the etch rate of the second portion 402 may be lower than the etch rate of the first portion 401 into which no impurity ions are implanted. Through the ion implantation of impurities such as boron (B), the etch selectivity between the first and second portions may be increased. Accordingly, portions having different etch selectivity may be selectively formed in the same polysilicon layer. The etch rate of the portions into which impurity ions are implanted may be relatively increased by implanting different kinds of impurity ions or different amounts of impurity ions, and the portions may be selectively etched in a subsequent process. In an embodiment of the present invention, the etch rate of the second portion 402 may be relatively decreased by implanting B, and the B-implanted portion may remain in a subsequent etching process.

Figure 9:
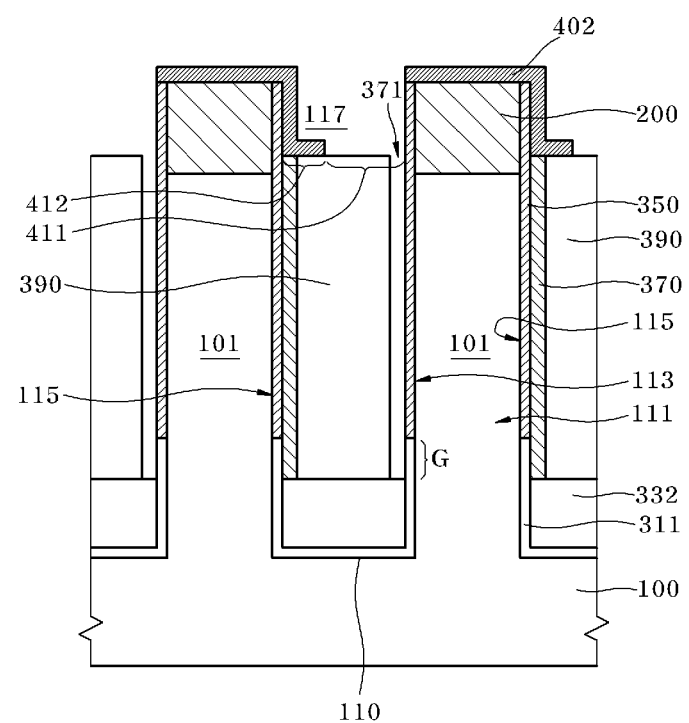

Referring to FIG. 9, the etch barrier layer 400 is selectively etched to selectively remove the first portion 401 which is an undoped polysilicon layer into which impurity ions have not been implanted. Accordingly, only the second portion 402 may remain of the etch barrier 400. The second portion 402 may also be referred to from this point on as an etch barrier 402. The etching process may be performed by a wet etching process using a wet etchant including, for example, ammonia and/or ammonium hydroxide ($NH_4OH$). An etch rate difference between the second portion 402 with implanted impurity ions and the first portion 401 without implanted impurity ions may be used to selectively remove the first portion 401, thereby leaving the etch barrier 402 that selectively exposes the first corner portion 411 of the second trench 117.

Using the etch barrier 402 as an etch mask, the exposed portion of the third liner 370 is selectively etched and removed. The etch barrier 402 selectively exposes only the third liner 370 at the first side surface 113 of the wall body 111, and shields the third liner 370 at the second side surface 115 in the opposite side. Therefore, only the third liner 370 at the first side surface 113 is one-side etched. Accordingly, an open path 371 is formed in the second trench 117, and the portion G of the first liner 311 is exposed to the bottom portion of the open path 371.

Figure 10:
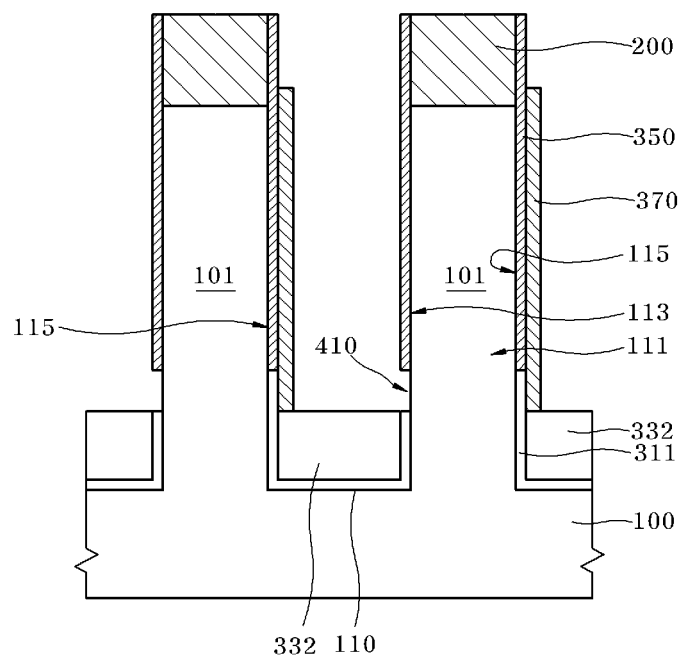

Referring to FIG. 10, the exposed portion G of the first liner 311 is removed to form an opening 410 that exposes a portion of the active region 101 in which a buried junction is to be formed. The process of removing the exposed portion G of the first liner 311 may be performed by an etching process through the open path 371. However, since the sacrifice layer 390 (FIG. 9) may be formed of substantially the same material as the first liner 311, for example, with silicon oxide, the exposed portion G of the first liner 311 may be etched and removed with the sacrifice layer 390. Accordingly, the opening 410 is formed in such a manner as to open the portion of the active region 101 in which a buried junction is to be formed.

Figure 11:
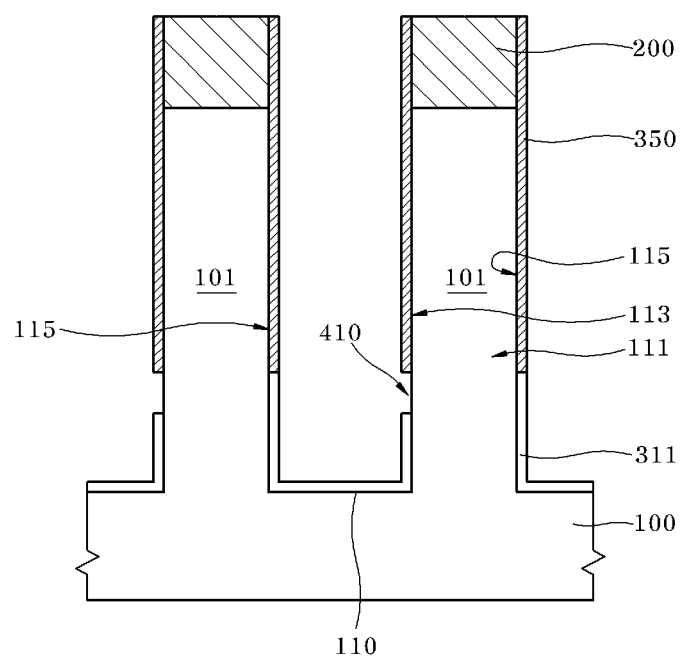

Referring to FIG. 11, the third liner 370 (FIG. 10), which has an etch selectivity with the sacrifice layer 390 (FIG. 9) and thus remains on the opposite sidewall when the sacrifice layer 390 is removed, is selectively removed to expose the second liner 350. The buried layer 332 (FIG. 10) is selectively removed. Accordingly, one side contact mask having the opening 410 is formed on the first side surface 113. The opening 410 is positioned in the lower portion of the active region 101 of the wall body 111, and spaced a predetermined distance from the bottom of the first trench 110 in consideration of the position where the buried bit line is to be formed.

As described above with reference to FIGS. 1 to 11, the one side contact mask is formed in such a manner that one side surface of the wall body 111 has the opening 410 which exposes a portion of the first side surface 113. Then, a buried junction to be used as a drain of a vertical transistor is formed through the opening 410. When forming the one side contact mask, the oblique ion implantation may be performed using the etch barrier 402 as shown in FIG. 9 according to an embodiment of the present invention. Without being limited thereto, however, a variety of other methods may be applied to form the opening 410 exposing a portion of the first side surface 113 as shown in FIG. 11. The buried junction is formed by doping impurities, and in order to reduce contact resistance of a buried bit line contacting the buried junction, high doping concentration may be desired. However, the buried junction needs to have a diffusion profile where the buried junction is diffused to such a depth (or distance) desired for the buried junction to operate as a drain. In order to secure the diffusion profile and the desired impurity concentration for the buried junction, a method of doping impurities having different diffusivities is implemented.

Figure 12:
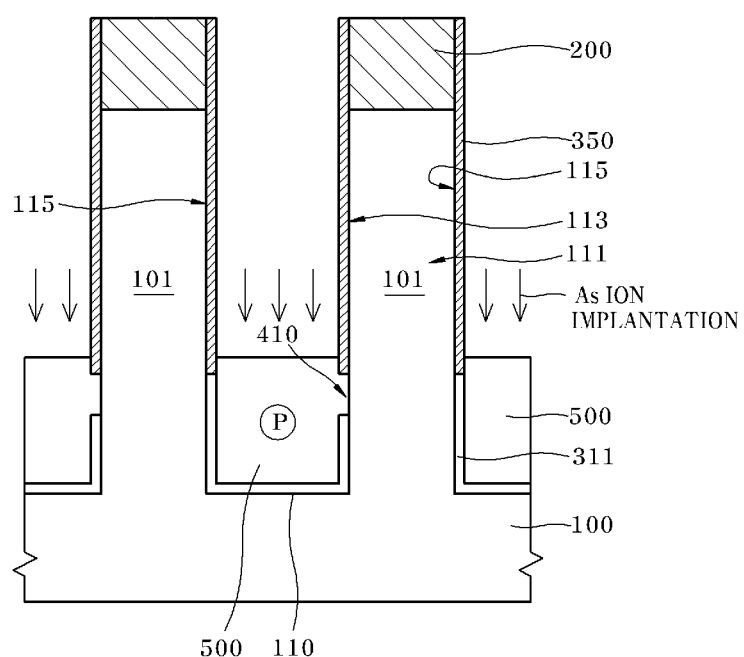

Referring to FIG. 12, impurities having different diffusivities are diffused into the exposed portion of the first side surface 113 of the wall body 111 through the opening 410 of the one side contact mask, thereby forming a buried junction including a first impurity layer and a second impurity layer surrounding the first impurity layer. As the impurities having different diffusivities are doped, the impurities may be diffused to different depths or distances into the active region 101 depending on the level of diffusivity. Therefore, the buried junction may be implemented by the first impurity layer formed by diffusing impurities having a relatively low diffusivity and the second impurity layer formed by diffusing impurities having a relatively high diffusivity that can diffuse deeper.

The first impurity layer may be formed by doping first impurities such as, for example, arsenic (As) at a relatively high concentration, and the second impurity layer may be formed by doping second impurities such as, for example, phosphorous (P) at a relatively low concentration. As the buried junction is formed in such a manner to include the first and second impurity layers having different impurities of different diffusivities, an ohmic contact may be formed at the contact interface between the to-be-formed buried bit line and the buried junction through the opening 410. Therefore, it may be possible to realize the reduction in contact resistance. Furthermore, as the second impurity layer is formed by diffusing P at a low concentration to a deeper depth, the desired diffusion depth may be implemented. Accordingly, the diffusion profile of the buried junction may be extended to the desired depth, and the concentration of the impurities at the contact portion between the buried junction and the buried bit line may be maintained to a high value.

The method of forming the first and second impurity layers by doping impurities having different diffusivities may include the following processes: a doping medium layer 500 is introduced, impurities are doped into the doping medium layer 500, and the impurities are diffused through a thermal treatment. For example, a polysilicon layer is deposited to fill the first trench 110. Phosphine ($PH_3$) and silicon source gas for the polysilicon layer such as, for example, silane ($SiH_4$) are provided together to deposit the polysilicon layer in which P is doped. The deposition is performed in the temperature range of 400° C. to 600° C. under a deposition chamber pressure condition of 0.3 to 2 Torr.

The deposited polysilicon layer is etched back to an upper portion of the opening 410 by dry etching to form the doping medium layer 500 that contacts the exposed surface of the first side surface 113 through the opening 410. After forming the doping medium layer 500 in which P as the second impurities is doped, As is ion-implanted as the first impurities into the doping medium layer 500. In consideration of a penetration depth at which As is ion-implanted, the polysilicon layer may be etched back in such a manner that the concentration of As ion-implanted into the polysilicon layer at an equal height to the opening 410 approaches substantially the maximum value. Through the ion implantation of As, P and As are doped together in the doping medium layer 500.

Because P has a relatively high diffusivity, the diffusion depth of P could be undesirably deep. In order to prevent P from being too deeply diffused, the diffusivity of P may be controlled by doping carbon (C) into the doping medium layer 500. Therefore, C may penetrate or diffuse to a position where P is to diffuse or penetrate inside a silicon (Si) crystalline structure, thereby disturbing the diffusion of P. Accordingly, it is possible to control the diffusivity or diffusion distance of P. C may be implanted into the doping medium layer 500 by ion implantation.

Figure 13:
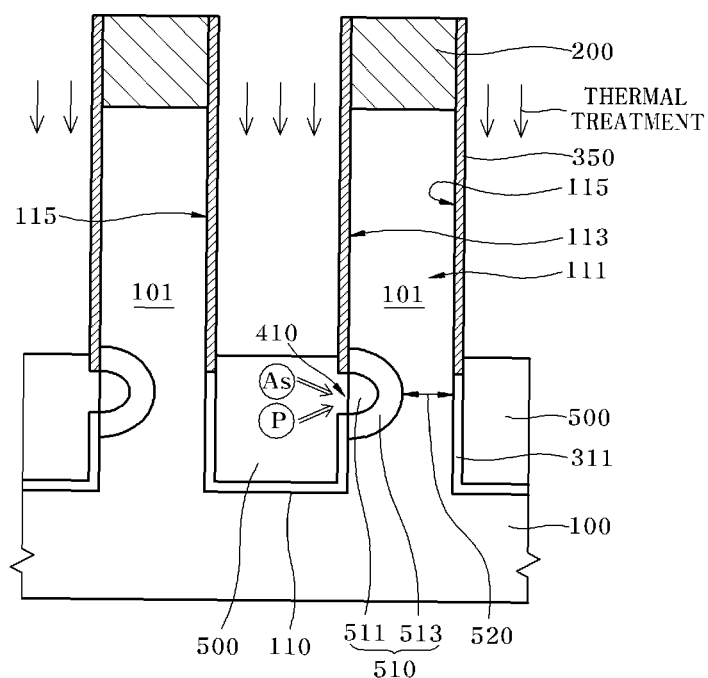

Referring to FIG. 13, a thermal treatment is performed in such a manner that P and As within the doping medium layer 500 are diffused to the active region 101 inside the first side surface 113 through the opening 410. Such a thermal treatment may be performed by a rapid thermal annealing (PTA) process which may apply high temperature heat in a short time, and may be performed in the temperature range of, for example, 800 to 1,100° C. The RTA process may be performed by using, for example, nitrogen gas ($N_2$) atmosphere. Alternatively, the RTA process may be performed using, for example, oxygen ($O_2$) annealing in an oxygen atmosphere.

When nitrogen gas or oxygen gas atmosphere is used, oxygen passivation by an oxide layer formed on the doping medium layer 500 may suppress impurity dopants from being lost to the outside. In this case, the impurity dopants may be more effectively diffused.

Since As the first impurity has a much lower diffusivity than P the second impurity, the diffusion depth of As in the lateral direction in the active region 101 is relatively less than the diffusion depth of P in the same direction. Thus, the portion of the active region 101 diffused with As forms the first impurity layer 511. Since P has a higher diffusivity than As, P may be diffused to a greater depth than As in the lateral direction inside the active region 101, thereby providing a diffusion profile forming the second impurity layer 513 surrounding the first impurity layer 511. Therefore, the buried junction 510 is formed to include the As diffusion profile of the first impurity layer 511 and the P diffusion profile of the second impurity layer 513 surrounding the first impurity layer 511.

Figure 14:
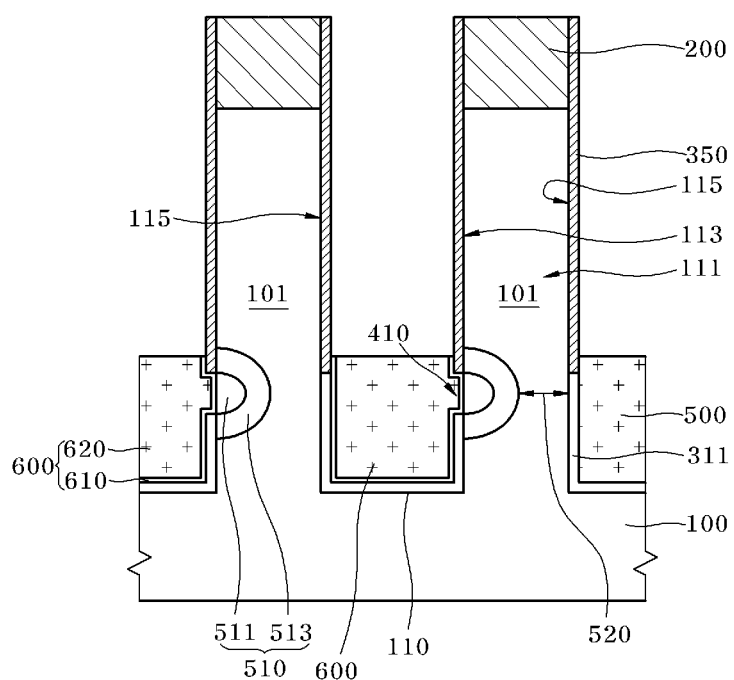

Referring to FIG. 14, the doping medium layer 500 (FIG. 13) is selectively removed, and a bit line conductive layer, for example, a metal layer 620 such as titanium nitride (TiN) is deposited in the first trench 110. The metal layer 620 may include a TiN layer or a tungsten (W) layer. At the interface between the metal layer 620 and the buried junction 510, a silicide layer such as $TiSi_x$ or a compound layer including Ti and TiN may be introduced as an interface layer 610 when the metal layer 620 is formed of W. The buried bit line 600, which includes the interface layer 610 and the metal layer 620, contacts the buried junction 510 through the opening 410. Accordingly, a one side contact is formed that contacts only the sidewall 113, and not the sidewall 115, of the active region 101.

Figure 15:
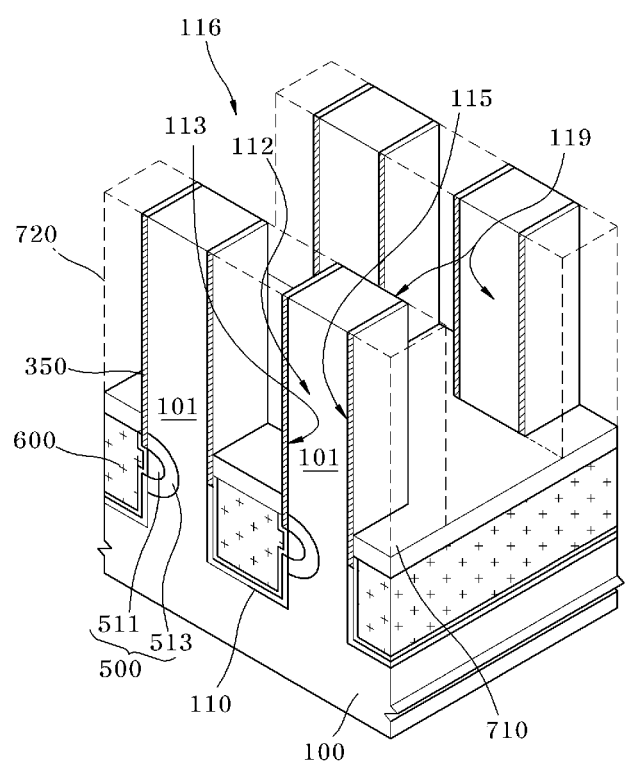

Referring to FIG. 15, after the bit line 600 is formed, a first insulation layer 710 for insulating the buried bit line 600 is formed in the first trench 110. The first insulation layer 710 may include, for example, silicon nitride ($Si_3N_4$). On the first insulation layer 710, a second insulation layer 720 is formed to fill the first trench 110. The second insulation layer 720 may be formed by applying, for example, spin on dielectric (SOD) such as polysilazane and densifying the SOD through a thermal treatment. A high density plasma (HDP) oxide layer may be further formed on the SOD layer and used as a layer for fixing the SOD layer. That is, the second insulation layer 720 may be formed as a dual layer including the SOD layer and the HDP oxide layer.

A third trench 116 is formed as a division trench that divides the wall body 111 including the active region 101 into unit cells to form active pillars 112.

Figure 16:
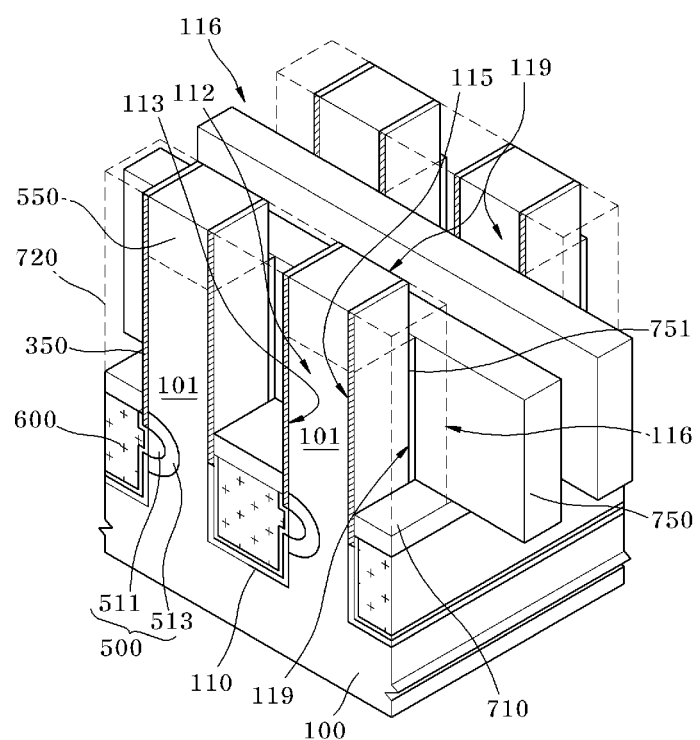

Referring to FIG. 16, the third trench 116 is formed to cross the buried bit line 600, and formed to expose a third side surface 119 of the active pillar 112 on which a gate 750 used as a word line is to be formed. The first insulation layer 710 or the second insulation layer 720 may partially remain on the bottom of the third trench 116 so as not to expose the buried bit line 600.

The third side surface 119 of the active pillar 112 exposed by the third trench 116 is formed to have a plane intersecting the first side surface 113 and the second side surface 115. On the exposed third side surface 119, a gate dielectric layer 751 is formed by performing, for example, thermal oxidation or the like.

On the gate dielectric layer 751, a gate 750 used as a word line is formed. The gate 750 is formed to attach to the gate dielectric layer 751, and may include a metal layer such as a W layer. A layer may be deposited in the third trench 116 and then an anisotropic dry etching process may be performed to form a separate gate 750 on each of the third surfaces 119 that are facing each other across the third trench 116. Accordingly, each of the active pillars 112 may be attached to one of the gates 750. At the interface between the W layer and the gate dielectric layer 751, a Ti/TiN layer may be introduced as an adhesive layer. The gates 750 are formed to extend in a direction that intersects the buried bit line 600. After the layer for the gates 750 is deposited and recessed to expose the side surfaces of the upper end portions of the active pillars 112, impurities having the same conductive type as the first and second impurities, for example, P, may be doped into upper end portions of the active pillars 112, thereby forming an upper junction 550 that may perform as a source terminal. As such, the vertical transistor may be formed, and capacitors are integrated to be coupled to the upper junction 550, thereby forming a DRAM memory cell.

In the vertical transistor in accordance with an embodiment of the present invention, the buried junction 510 is formed by the hybrid doping method using As and P as impurities having different diffusivities. Therefore, with the reduction in the contact resistance for the buried junction, the junction diffusion profile may be formed in a desired shape.

Figure 17:
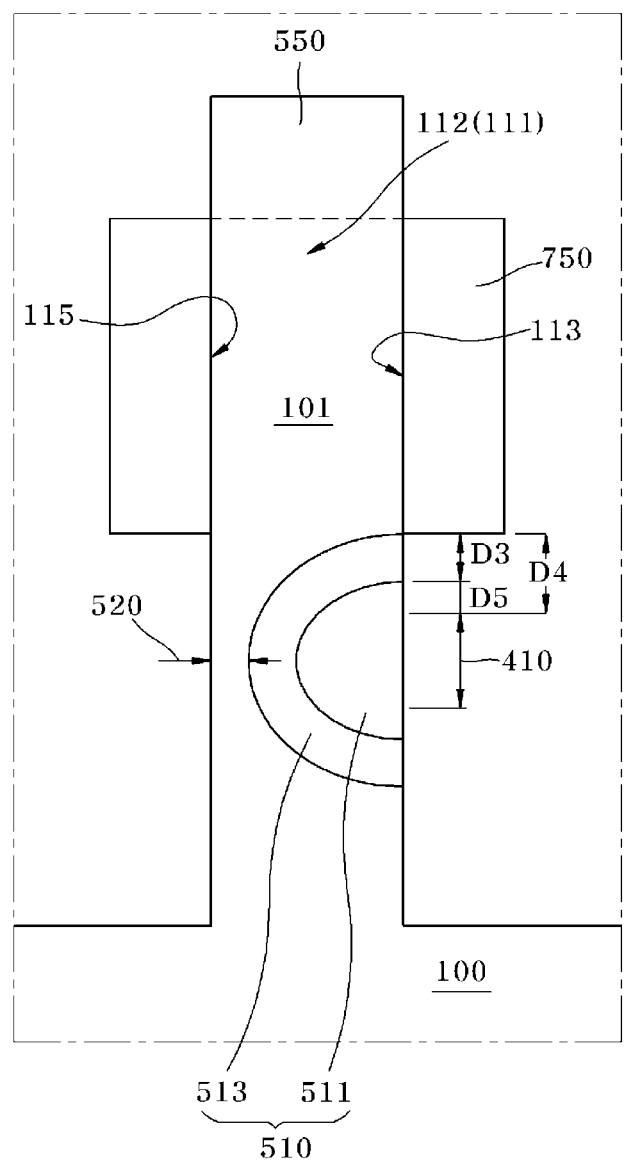
FIGS. 17 to 19 are diagram explaining an effect of the vertical transistor having a buried junction and the method for manufacturing the same in accordance with an embodiment of the present invention.

Referring to FIG. 17, the buried junction 510 is formed as an one side contact (OSC) in the lower portion of the wall body 111 including the active region 101, or the active pillar 112 formed by dividing the wall body 111. The buried junction 510 includes the first impurity layer 511 in which As with a low diffusivity is diffused, and the second impurity layer 513 in which P with a relatively high diffusivity is diffused. Since As in the first impurity layer 511 has low diffusivity, the diffusion profile of the first impurity layer 511 does not extend greatly in the lateral direction, but may be limited more toward the first side surface 113 of the OSC even though As is doped at a high concentration. In other words, the diffusion profile of the first impurity layer 511 may be suppressed from extending greatly in the lateral direction, and the concentration of As within the first impurity layer 511 may be increased. Since the first impurity layer 511 is positioned adjacent to the surface layer of the first side surface 113 exposed to the opening 410, the buried bit line 600 contacted through the opening 410 is electrically connected to the first impurity layer 511.

Figure 18:
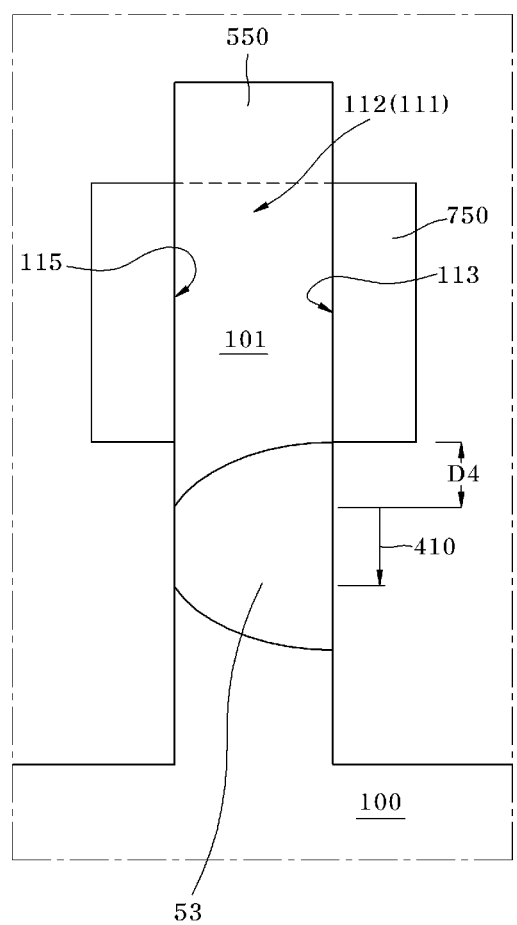

An ohmic contact may be formed to reduce the contact resistance of the buried bit line 600 (FIG. 16). In order to form the ohmic contact, the concentration of the first impurity layer 511 may be set to a high value. However, when dopants with diffusivity greater than the diffusivity of As are doped into the first impurity layer 511, the diffusion depth profile may increase with the concentration. In this case, the diffusion profile 53 (FIG. 18) may extend toward the second side surface 115 of the same wall body 111. When the diffusion profile 53 of the buried junction extends to the second side surface 115 from the first side surface 113, a floating body structure may be formed where the portion of the active region 101 overlapping the gate 750 and the semiconductor substrate 100 are isolated from each other by the diffusion profile 53. In such a floating body structure, hole charges piled up at the portion of the active region 101 under the gate 750 cannot escape toward the semiconductor substrate 100. Therefore, the hole charges which are continuously piled up may have an adverse effect upon the operation of the transistor, thereby causing a malfunction.

Because As is used as the impurity dopant of the first impurity layer 511 in an embodiment of the present invention, the low diffusivity of As may suppress the diffusion profile of the first impurity layer 511 from extending too deeply in a lateral direction, even though the dopant concentration is increased. Accordingly, the concentration of the first impurity layer 511 may be set to a high level desired for the ohmic contact, for example, in the range of 5E19 dose/cm$^3$ to 7E20 dose/cm$^3$.

When forming the first impurity layer 511 with As doping, the low diffusivity of As is advantageous for suppressing the detrimental depth extension of the diffusion profile, but the low diffusivity of As may be disadvantageous in that the first impurity layer 511 is separated at a distance D3 from a channel position overlapped by the gate 750. The opening 410 is positioned at a deeper position separated at a predetermined distance D4 from the gate 750. Such a structure is provided to secure a separation margin between the buried bit line 600 connected to the buried junction 510 through the opening 410 and the gate 750 formed to cross the buried bit line 600. The separation margin between the buried bit line 600 and the gate 750 may be set to, for example, about 40 nm. Such a separation margin may prevent a short circuit between the buried bit line 600 and the gate 750 by securing a process margin.

When such a separation margin is reduced, it is difficult to secure the process margin. Furthermore, during the operation of the transistor, a mismatch phenomenon may occur where a threshold voltage Vt during a read or write operation of DRAM may vary due to occurrence or disturbance of parasitic capacitance between the buried bit line 600 and the gate 750. Therefore, the desired separation distance and the insulation may be secured with the first insulation layer 710 (FIG. 16) and/or the second insulation layer 720 (FIG. 16) introduced between the buried bit line 600 and the gate 750.

Forming the buried junction 510 only with the first impurity layer 511 may lead to undesired characteristics. This may be because the end portion of the diffusion profile of the first impurity layer 511 should overlap with the gate 750. However, since the diffusion distance D5 is limited by the low diffusivity of As, the separation distance D3 occurs between the first impurity layer 511 and the gate 750. The occurrence of the separation distance D3 may cause a rapid increase of the threshold voltage Vt of the transistor. When the separation distance D3 is measured at 20 nm, an increase of the threshold voltage corresponding to 1V or more is experimentally measured at an impurity concentration of 1E12 dose/cm$^3$ in the channel, compared to when the first impurity layer 511 and the gate 750 are not separated from each other. When the concentration of As is split in the range of 7E20 dose/cm$^3$ to 3E20 dose/cm$^3$, it is experimentally measured that the threshold voltage Vt rapidly increases to a level ranging from 1.2 to 1.6V. In order to suppress the increase of the threshold voltage, the separation distance D3 needs to be reduced. For this reduction, the separation distance D4 of the opening 410 may be reduced, which may be difficult to perform because the desired separation distance between the buried bit line 600 and the gate 750 needs to be secured.

To compensate for the increasing threshold voltage when only As having a low diffusivity is used, the second impurity layer 513 is formed to implement a broader diffusion profile of the buried junction 510. P having a relatively high diffusivity is doped into the second impurity layer 513, and may be doped at a lower concentration than that of As. P may be doped, for example, at a concentration substantially ranging from 6.3E16 dose/cm$^3$ to 5.7E19 dose/cm$^3$. The second impurity layer 513 is diffused deeper than the first impurity layer 511, due to a relatively high diffusivity of phosphorus. Accordingly, the diffusion profile can extend to a greater depth. The second impurity layer 513 may be formed to surround the first impurity layer 511, and the diffusion profile of the entire buried junction 510 may extend to partially overlap the channel which is the portion of the active region 101 overlapped with the gate 750. This is because, as shown in FIG. 19, the diffusivity or diffusion distance of P is larger than that of As.

Figure 19:
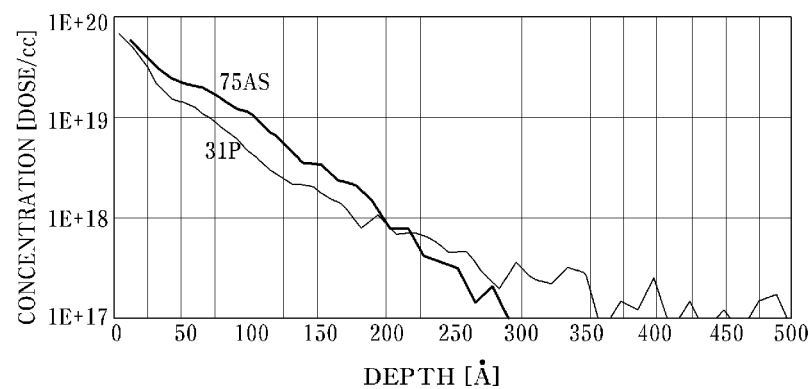

FIG. 19 shows results obtained by measuring the diffusion profiles of Arsenic-75 (75As) and Phosphorous-31(31P) through a secondary ion mass spectroscopy (SIMS). 75A and 31P are stable and considered monoisotopic elements. When diffusion depths are measured at a concentration of 1E18 dose/cm$^3$, the diffusion depth of 75As is measured to 203 Å, while the diffusion depth of 31P is measured to 175 Å. The concentration of 75As at the surface is set to 6.5E19 dose/cm$^3$, and the concentration of 31P is set to 5.7E19 dose/cm$^3$, and the entire concentration is set to 1.25E20 dose/cm$^3$. A thermal treatment for the diffusion is performed at temperature of 1,000° C. through the RTA process for about 10 seconds. In FIG. 19, the profiles measured by the SIMS show that 31P is diffused deeper.

As the second impurity layer 513 is formed by doping P, the diffusion profile of the entire buried junction 510 may extend to abut the channel that is the portion of the active region 101 overlapping the gate 750. Accordingly, the threshold voltage Vt of the transistor may be reduced to a level ranging from 0.6 to 0.2V. This shows that it is possible to compensate for a rapid increase of the threshold voltage that occurs when the buried junction 510 includes only the first impurity layer 511 into which only As is doped. As the doping concentration of P for the second impurity layer 513 is set to be lower than that of As, the second impurity layer 513 may be separated at a predetermined distance 520 (FIG. 21) from the second side surface 115. That is, the concentration of P may be reduced to suppress the diffusion profile of the second impurity layer 513 from excessively extending toward the second side surface 115.

Such a structure may be implemented when the impurity doping concentration level required for the ohmic contact is realized by increasing the doping concentration of As and the broad diffusion profile is realized by doping P. As the second impurity layer 513 is separated at the predetermined distance 520 from the second side surface 115, a body structure may be implemented where the portion of the active region 101 under the channel and the semiconductor substrate 100 are not separated. Accordingly, hole charges may escape toward the semiconductor substrate 100, thereby effectively suppressing the hole charges from being piled up.

In an embodiment of the present invention, since the contact concentration is secured by using As with a low diffusivity and the junction depth is secured by using P with a high diffusivity, the buried junction 510 is formed as a broad junction having a gentle profile. Accordingly, the reduction of electrical fields may be realized by the broad profile, and channel and junction resistance may be reduced to realize a stable transistor operation. While the concentration of As is maintained to a high value, the overlap between the buried junction 510 and the channel under the gate 750 may be secured. Therefore, the separation margin between the buried bit line 600 and the word line as the gate 750 may be secured, and the threshold value Vt of the cell transistor may be effectively kept from increasing. Furthermore, the process of implementing the buried junction 510 may be performed using the ion implantation and the deposition equipment for depositing polysilicon. Accordingly, it is possible to manufacture the vertical transistor without introducing new equipment.

A variety of modified doping methods may be applied as the method for forming the buried junction of the vertical transistor in accordance with the embodiment of the present invention, as long as As and P are doped together. These modifications are described with respect to FIGS. 20-26.

Figure 20:
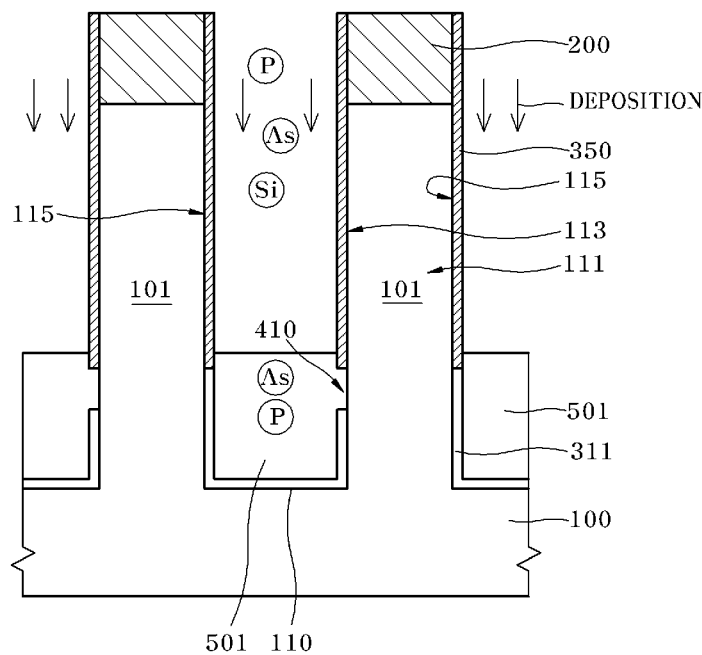
FIGS. 20 to 26 are diagrams illustrating modifications of the method for manufacturing the vertical transistor having a buried junction in accordance with an embodiment of the present invention.

Referring to FIG. 20, a polysilicon layer in which low-concentration P and high-concentration As are doped together is deposited. The polysilicon layer is then etched back to the upper portion of the opening 410 of the one side contact mask, thereby forming a doping medium layer 501.

Figure 21:
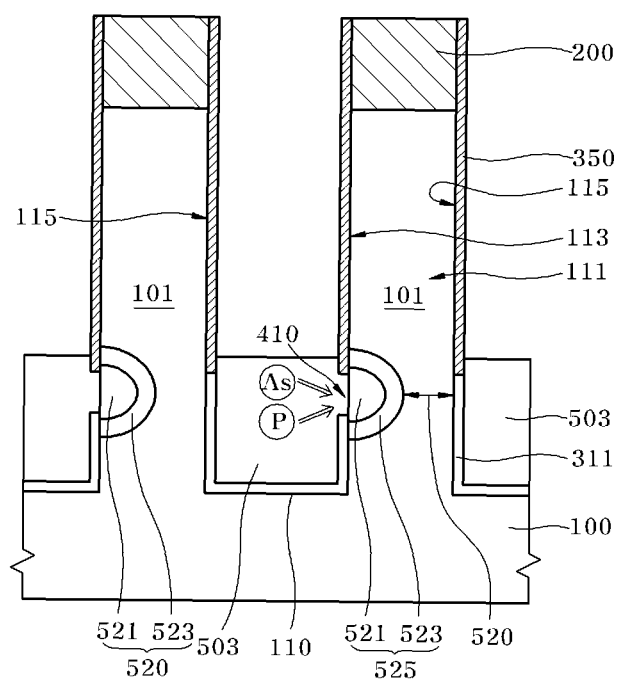

Referring to FIG. 21, the doping medium layer 501 may be diffused by the RTA process to form a buried junction 525 including a first impurity layer 521 and a second impurity layer 523. In this case, an ion implantation process or the like may be omitted by doping As and P together when the doped polysilicon layer is deposited.

Figure 22:
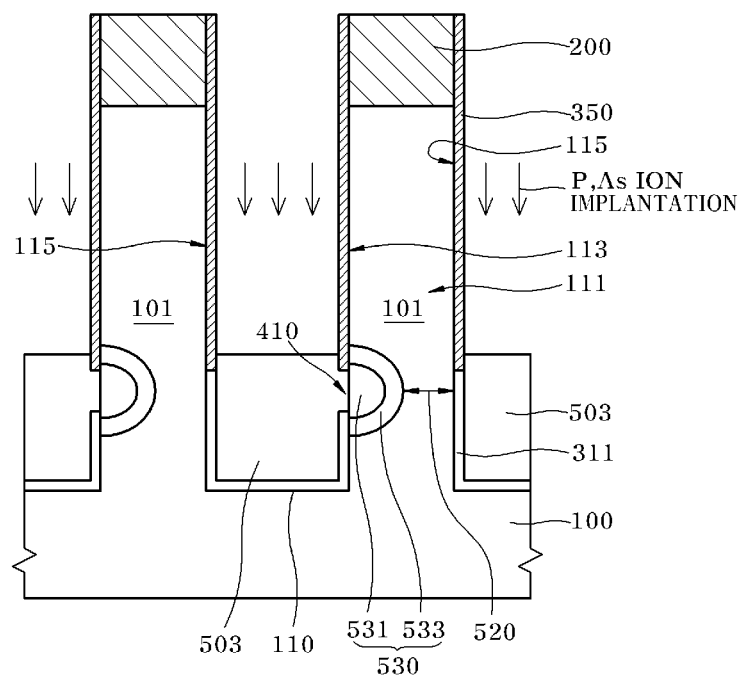

Referring to FIG. 22, undoped polysilicon in which impurities are not doped is deposited, and then etched back to the upper portion of the opening 410 of the one side contact mask. Then, low-concentration P and high-concentration As may be doped by a doping method such as ion implantation, thereby forming a doping medium layer 503. The doping medium layer 503 may be diffused by the RTA process to form a buried junction 530 including a first impurity layer 531 and a second impurity layer 533. The doping of As and P may be performed by providing an As compound or P compound in the form of doping source gas, instead of ion implantation. In this case, as the undoped polysilicon layer is deposited and As and P are doped by the ion implantation, the formation process of the doped polysilicon layer may be simplified.

Figure 23:
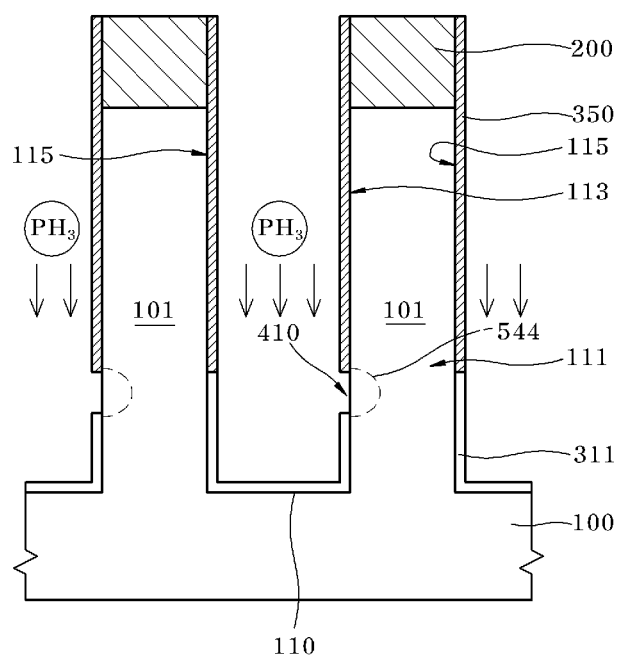

Referring to FIG. 23, a doping source of P compound such as phosphine gas is provided to the opening 410 of the one side contact mask, and P is directly doped into the first side surface 113. Accordingly, a P-doped layer 544 is formed. Then, a process of doping As, for example, an ion implantation process may be performed. In this case, As may be directly implanted into the exposed portion of the first side surface 113.

Figure 24:
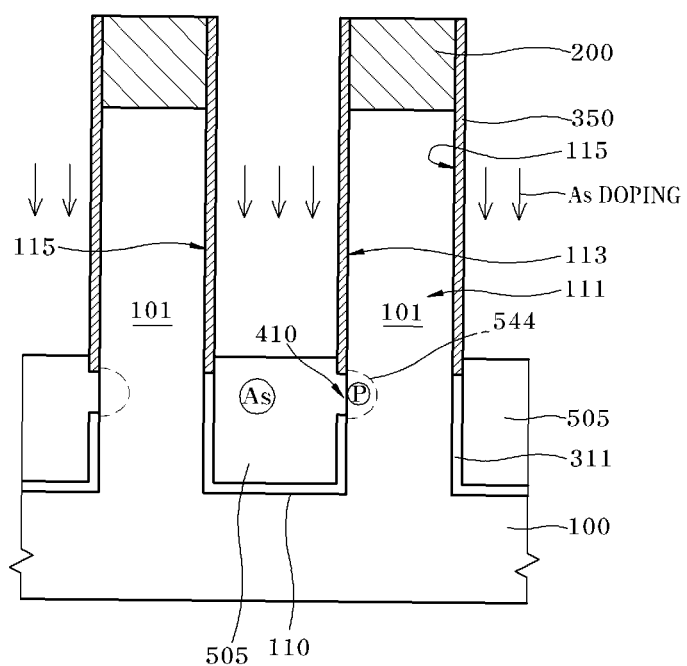
Figure 25:
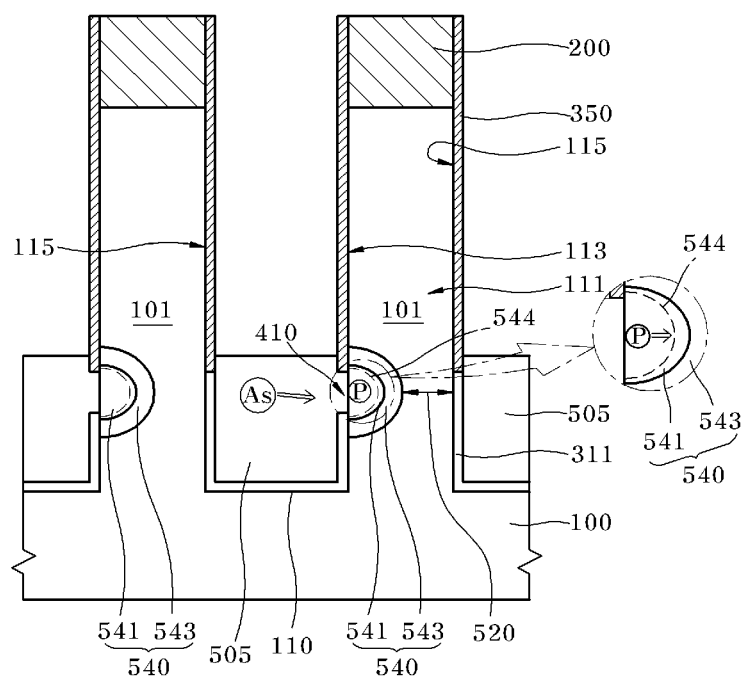

Alternatively, referring to FIG. 24, a doping medium layer 505 as an As-doped polysilicon layer may be formed. Then, referring to FIG. 25, the doping medium layer 505 is diffused by the RTA process to form a buried junction 540 including a first impurity layer 541 and a second impurity layer 543. The doping medium layer 505 of the As-doped polysilicon layer may be formed by the following process: an undoped polysilicon layer is deposited and etched back, and As is then ion-implanted to form the doping medium layer 505.

Figure 26:
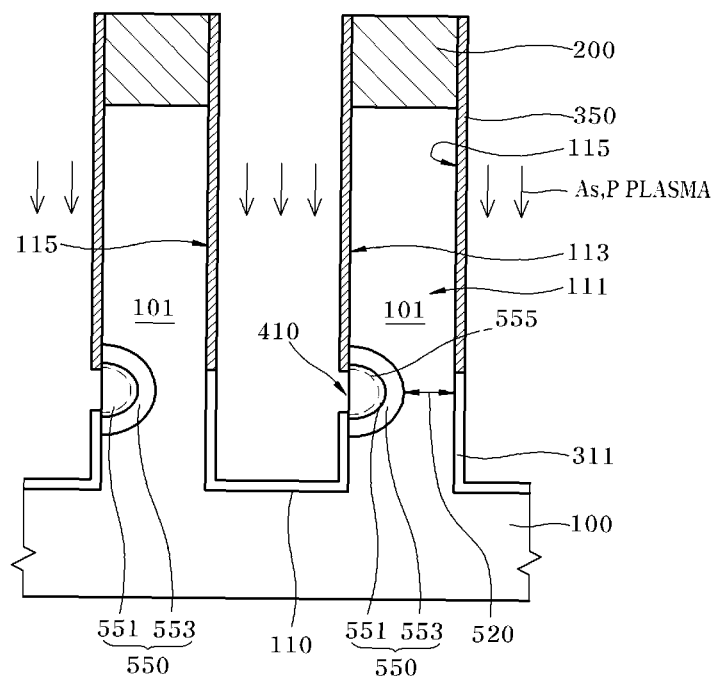

Referring to FIG. 26, P and As may be directly doped into the first side surface 113 exposed through the opening 410 of the one side contact mask, thereby forming a doped layer 555. Then, as a P compound is plasma-excited and provided to the first side surface 113, the excited P may be plasma-doped in the first side surface 113. Furthermore, as an As compound is plasma-excited and provided to the first side surface 113, the excited As may be plasma-doped into the first side surface 113. The RTA process is performed on the doped layer 555 formed by plasma doping, thereby diffusing the doped impurity dopants. Then, a buried junction 550 including a first impurity layer 551 and a second impurity layer 553 may be formed.

After the doping medium layer 500 is formed as illustrated in FIG. 13, the diffusion of impurities is induced through a thermal treatment. Then, the doping medium layer 500 may be used as a bit line rather than being removed. For example, referring to FIG. 14, a separate conductive layer for the bit line 600 is deposited, and a polysilicon layer as the doping medium layer 500, in which impurities are doped, may be left and used as the bit line 600 without performing a process of selectively removing the doping medium layer 500. Since the bit line 600 is formed by using only the polysilicon layer, a selective etching process and a process of depositing and etching a separate conductive layer may be omitted. Therefore, it is possible to reduce the number of processes.

The RTA process for diffusing impurities may be performed by an oxygen annealing process using an oxygen atmosphere. For example, when an atmosphere including nitrogen gas or oxygen gas is used, oxygen passivation by an oxide layer formed on the doping medium layer 500 may suppress impurity dopants from being lost to the outside. In this case, the impurity dopants may be more effectively diffused. Accordingly, the impurities within the doping medium layer 500 may be suppressed from leaking to the outside of the surface during the RTA process and being lost, which makes it possible to maintain high conductivity of the bit line including the doping medium layer 500.

Figure 27:
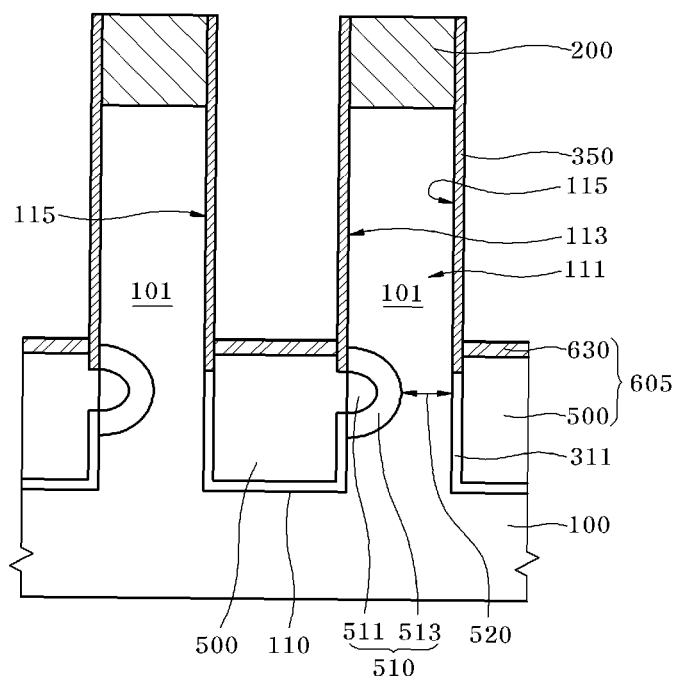
FIG. 27 is a diagram illustrating using a metal layer to form a bit line.

Referring to FIG. 27, a metal layer having high conductivity, for example, a metal layer 630 such as W or Ti may be additionally deposited on the polysilicon layer used as the doping medium layer 500, thereby forming a bit line 605. In this case, in order to suppress an oxidized layer from being formed on the polysilicon layer surface of the doping medium layer 500, the RTA process may be performed in an inert gas atmosphere which does not induce oxygen passivation. The inert gas atmosphere may be, for example, nitrogen gas atmosphere. In some cases, the doping medium layer 500 may be partially recessed to a predetermined depth, and the metal layer 630 may be then deposited.

In accordance with various embodiments of the present invention, the junction depth to which the dopants are diffused may be controlled while the concentration of the dopant is maintained at a high value. Therefore, a broader junction profile may be induced to remove the separation distance between the junction and the channel region, which makes it possible to suppress a rapid increase of the channel threshold voltage. Furthermore, since the diffusion profile of the junction may be effectively kept from extending too far, the channel region is substantially prevented from being isolated by the junction, which makes it possible to effectively suppress the induction of the floating body effect. Furthermore, since the dopant concentration at the surface portion of the junction may be set to a higher value, the junction contact resistance with the buried bit line contacted and coupled to the junction may be reduced.

What is claimed is:

1. A method for manufacturing a junction of a vertical transistor, comprising:
    forming a trench in a semiconductor substrate to form first and second wall bodies, wherein the trench has sidewalls comprising a first side surface of the second wall body and a second side surface of the first wall body;
    forming a one side contact mask having an opening that selectively exposes a portion of only the first side surface of the second wall body; and
    forming a first impurity layer and a second impurity layer surrounding the first impurity layer in the second wall body by diffusing impurities having different diffusivities into the second wall body through the exposed portion of the first side surface,
    wherein the impurity used for forming the first impurity layer comprises arsenic (As) and the impurity used for forming the second impurity layer comprises phosphorus (P), and
    wherein the concentration of phosphorus (P) in the second impurity layer is less than the concentration of arsenic (As) in the first impurity layer.

2. The method of claim 1, wherein the second impurity layer extends toward a first side surface of the second wall body.

3. A method for manufacturing a junction of a vertical transistor, comprising:
    forming a trench in a semiconductor substrate to form first and second wall bodies, wherein the trench has sidewalls comprising a first side surface of the second wall body and a second side surface of the first wall body;
    forming a one side contact mask having an opening that selectively exposes a portion of only the first side surface of the second wall body; and
    forming a first impurity layer and a second impurity layer surrounding the first impurity layer in the second wall body by diffusing impurities having different diffusivities into the second wall body through the exposed portion of the first side surface, wherein forming the first impurity layer and the second impurity layer comprises:
    applying via a doping medium layer in the trench first and second impurities to the exposed portion of the first side surface of the second wall body; and
    performing a thermal treatment to diffuse the first and second impurities into the second wall body through the exposed portion of the first side surface of the second wall body, and
    wherein forming the doping medium layer comprises:
    depositing the doping medium layer in which phosphorus (P) is doped as the second impurity in the trench between the first and second wall bodies; and
    etching a portion of the doping medium layer above the opening of the one side contact mask such that the remaining portion of the doping medium layer is in contact with the exposed portion of the first side surface of the second wall body.

4. The method of claim 3, wherein the doping medium layer comprises arsenic as the first impurity and phosphorus as the second impurity.

5. The method of claim 3, wherein arsenic (As) is ion-implanted in to the remaining portion of the doping medium layer after etching.

6. The method of claim 3, wherein the thermal treatment is performed at a temperature range of substantially 800° C. to 1,100° C.

7. The method of claim 3, wherein the thermal treatment is performed in an atmosphere including at least one of nitrogen gas and oxygen gas.

8. A method for manufacturing a junction of a vertical transistor, comprising:
    forming a trench in a semiconductor substrate to form first and second wall bodies, wherein the trench has sidewalls comprising a first side surface of the second wall body and a second side surface of the first wall body;
    forming a one side contact mask having an opening that selectively exposes a portion of only the first side surface of the second wall body; and forming a first impurity layer and a second impurity layer surrounding the first impurity layer in the second wall body by diffusing impurities having different diffusivities into the second wall body through the exposed portion of the first side surface, wherein forming the one side contact mask comprises:
    forming a first liner covering lower portions of the first side surface of the second wall body and the second side surface of the first wall body, and a second liner covering upper portions above the first liner on each of the first and second side surfaces;

forming a buried layer in a lower portion of the trench below the second liner;

forming a third liner covering the second liner and a portion of the first liner not covered by the buried layer;

forming a sacrifice layer above the buried layer such that the sacrifice layer fills a space between the third liner on the first wall body and the third liner on the second wall body;

removing a portion of the third liner and the sacrifice layer to expose upper portions of the second liner;

forming an etch barrier that is used to selectively expose the second liner on the first side surface of the second wall body, the end portion of the third liner on the second liner on the first side surface of the second wall body, and a portion of the sacrifice layer adjacent to the third liner on the second liner on the first side surface of the second wall body;

removing the third liner exposed by the etch barrier so as to form a groove between the sacrifice layer and first and second liners on the first side surface of the second wall body;

forming the opening that exposes the portion of the first side surface by selectively removing the portion of the first liner exposed to the groove; and forming the one side contact mask that includes the remaining first and second liners by selectively removing the sacrifice layer and the third liner remaining on the second side surface of the first wall body.

9. The method of claim 8, wherein forming the etch barrier comprises:

forming a polysilicon layer covering top surfaces of the wall bodies, the second liner, the third liner, and the sacrifice layer;

performing an ion implantation process at an oblique angle to the top of the wall body for selectively implanting impurity ions into the polysilicon layer except for a portion on the first side surface of the second wall body and a portion covering the trench near the second wall body; and selectively removing the portions of the polysilicon layer into which the impurity ions are not implanted.

10. A method for forming a junction of a vertical transistor, comprising:

forming a first and second wall bodies from a semiconductor substrate, each of the wall bodies having a first side surface and an opposing second side surface; and forming a first impurity layer and a second impurity layer having a lower concentration than the first impurity layer in a portion of the first side surface of the second wall body such that the second impurity layer surrounds the first impurity layer, wherein forming the first impurity layer and the second impurity layer comprises:

forming a one side contact mask having an opening that selectively exposes a portion of the first side surface of the second wall body;

forming a P-doped polysilicon layer to contact the portion of the first side surface exposed by the opening of the one side contact mask;

doping As into the polysilicon layer through ion implantation; and performing a thermal treatment to diffuse the doped P and As in to the portion of the first side surface.

11. A method for manufacturing a vertical transistor, comprising:

forming vertically rising first and second wall bodies from a semiconductor substrate, each of the wall bodies having a first side surface and an opposing second side surface, and the first and second wall bodies separated by a first trench;

forming a one side contact mask having an opening that selectively exposes a portion of the first side surface of the second wall body;

forming a buried junction including a first impurity layer and a second impurity layer surrounding the first impurity layer by diffusing first and second impurities having different diffusivities into the portion of the first side surface exposed by the opening; and forming a buried bit line buried between the wall bodies, wherein the buried bit line is electrically coupled to the buried junction via the opening of the one side contact mask, wherein the first impurity layer is formed using the first impurity As, and the second impurity layer is formed using the second impurity P, and wherein P in the second impurity layer is at a lower concentration than As in the first impurity layer.

12. The method of claim 11, wherein the second impurity layer is formed by diffusing P such that the second impurity layer does not contact the second side surface of the second wall body.

13. A method for manufacturing a vertical transistor, comprising:

forming vertically rising first and second wall bodies from a semiconductor substrate, each of the wall bodies having a first side surface and an opposing second side surface, and the first and second wall bodies separated by a first trench;

forming a one side contact mask having an opening that selectively exposes a portion of the first side surface of the second wall body;

forming a buried junction including a first impurity layer and a second impurity layer surrounding the first impurity layer by diffusing first and second impurities having different diffusivities into the portion of the first side surface exposed by the opening; and forming a buried bit line buried between the wall bodies, wherein the buried bit line is electrically coupled to the buried junction via the opening of the one side contact mask, wherein forming the buried junction including the first impurity layer and the second impurity layer comprises:

doping P by providing phosphine gas to the portion of the first side surface exposed by the opening of the one side contact mask;

forming a doping medium layer including As such that the doping medium layer contacts the portion of the first side surface exposed by the one side contact mask; and performing a thermal treatment for diffusing the doped As into the portion of the first side surface contacted by the doping medium layer to form the first impurity layer and diffusing the doped P to form the second impurity layer.

14. The method of claim 13, wherein forming the buried junction including the first impurity layer and the second impurity layer comprises:

forming a doping medium layer including a second impurity such that the doping medium layer contacts the portion of the first side surface exposed by the opening of the one side contact mask;

doping a first impurity having a lower diffusivity than the second impurity into the doping medium layer; and performing a thermal treatment for diffusing the doped first and second impurities to the portion of the first side surface exposed by the opening.

15. The method of claim 14, wherein the forming of the doping medium layer comprises;
   depositing a polysilicon layer in which P is doped as the second impurity between the first and second wall bodies;
   etching back the polysilicon layer to above the opening of the one side contact mask; and
   ion-implanting As as the first impurity in to the etched-back polysilicon layer.

16. The method of claim 15, wherein the polysilicon layer is used to form the buried bit line.

17. The method of claim 16, further comprising depositing a metal layer on the polysilicon layer to form the buried bit line.

18. The method of claim 13, wherein forming the buried junction including the first impurity layer and the second impurity layer comprises:
   forming a doping medium layer including first and second impurities having different diffusivities such that the doping medium layer contacts the portion of the first side surface exposed by the opening of the one side contact mask; and
   performing a thermal treatment for diffusing the doped first and second impurities to the portion of the first side surface exposed by the opening.

19. The method of claim 18, wherein forming the doping medium layer comprises:
   depositing a polysilicon layer in which As and P are doped as the first and second impurities, respectively; and
   etching back the polysilicon layer to above the opening of the one side contact mask.

20. The method of claim 18, wherein forming the doping medium layer comprises:
   depositing an undoped polysilicon layer to fill a space between the first and second wall bodies;
   etching back the polysilicon layer to above the opening of the one side contact mask; and
   ion-implanting As and P into the polysilicon layer.

21. The method of claim 13, wherein forming the doping medium layer including As comprises depositing an As-doped polysilicon layer.

22. The method of claim 13, wherein forming the doping medium layer including As comprises:
   depositing an undoped polysilicon layer; and
   ion-implanting As into the polysilicon layer.

23. The method of claim 13, wherein forming the buried junction including the first impurity layer and the second impurity layer comprises:
   doping As and P into the portion of the first side surface exposed by the opening of the one side contact mask; and
   performing a thermal treatment for diffusing the doped As and P.

24. The method of claim 23, wherein the doping of As and P is performed by a plasma doping process to provide plasma of As and P to the portion of the first side surface exposed by the opening of the one side contact mask.

25. The method of claim 13, wherein forming the one side contact mask comprises:
   forming a first liner covering lower portions of the first side surface of the second wall body and second side surface of the first wall body, and a second liner covering upper portions above the first liner on each of the first and second side surfaces;
   forming a buried layer in a lower portion of the first trench below the second liner;
   forming a third liner covering the second liner and a portion of the first liner not covered by the buried layer;
   forming a sacrifice layer above the buried layer such that the sacrifice layer fills a space between the third liner on the first wall body and the third liner on the second wall body;
   recessing the third liner and the sacrifice layer so that a bottom portion of the recessed area comprises upper surfaces of the third liner and upper surface of the sacrifice layer, and side portions of the recessed area comprise the second liner;
   forming an etch barrier that is used to selectively expose the second liner on the first side surface of the second wall body, the end portion of the third liner on the second liner on the first side surface of the second wall body;
   removing the third liner exposed by the etch barrier to form a groove between the sacrifice layer and the first and second liners on the first side surface of the second wall body;
   forming the opening that exposes the portion of the first side surface by removing the portion of the first liner exposed to the groove; and
   forming the one side contact mask that includes the remaining first and second liners by selectively removing the sacrifice layer and the third liner remaining on the second side surface of the first wall body.

26. The method of claim 25, wherein the forming of the etch barrier comprises:
   forming a polysilicon layer covering top surfaces of the wall bodies, the second liner, the third liner, and the sacrifice layer;
   performing an oblique ion implantation process at an oblique angle to the top of the wall body for selectively implanting impurity ions in to the polysilicon layer except for a portion on the first side surface of the second wall body and a portion covering the first trench near the second wall body; and
   selectively removing the portions of the polysilicon layer into which impurity ions are implanted.

27. The method of claim 13, wherein further comprising:
   forming a division trench that intersects the first trench to divide the first and second wall bodies into a plurality of active pillars;
   forming a gate dielectric layer on portions of side surfaces of the active pillars exposed to the division trench; and
   forming a gate in the division trench such that the gate crosses the buried bit line; and
   forming an upper junction corresponding to the buried junction of an active pillar by doping a third impurity layer into an upper end portion of the active pillar.

28. The method of claim 27, wherein there is no separation in the vertical direction between the second impurity layer and the gate, and
   the first impurity layer is separated from the gate in the vertical direction.

29. The method of claim 28, wherein the gate is positioned higher than the opening of the one side contact mask such that the first impurity layer is separated from the gate in the vertical direction.

* * * * *